(12) United States Patent
Breitling et al.

(10) Patent No.: US 10,059,583 B2
(45) Date of Patent: Aug. 28, 2018

(54) MICRO-MECHANICAL COMPONENT

(71) Applicant: Robert Bosch GmbH, Stuttgart (DE)

(72) Inventors: Achim Breitling, Reutlingen (DE);
Christof Schwenk, Glatten (DE);
Hartmut Kueppers, Reutlingen (DE);
Nicole Schittenhelm, Reutlingen (DE);
Volker Schmitz, Pfullingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/673,118

(22) Filed: Aug. 9, 2017

(65) Prior Publication Data

US 2018/0044171 A1    Feb. 15, 2018

(30) Foreign Application Priority Data

Aug. 11, 2016  (DE) .................. 10 2016 214 966

(51) Int. Cl.
| | |
|---|---|
| *H01L 27/20* | (2006.01) |
| *H01L 29/84* | (2006.01) |
| *B81B 7/00* | (2006.01) |
| *B81B 7/02* | (2006.01) |
| *B81C 1/00* | (2006.01) |
| *G01P 3/00* | (2006.01) |
| *G01P 15/00* | (2006.01) |

(52) U.S. Cl.
CPC .............. *B81B 7/0038* (2013.01); *B81B 7/02* (2013.01); *B81C 1/00285* (2013.01); *G01P 3/00* (2013.01); *G01P 15/00* (2013.01)

(58) Field of Classification Search
None
See application file for complete search history.

(56) References Cited

U.S. PATENT DOCUMENTS

| | | | |
|---|---|---|---|
| 8,546,928 B2 | 10/2013 | Merz et al. | |
| 2008/0037197 A1* | 2/2008 | Casset .................. | H01G 5/0132 361/287 |
| 2016/0244325 A1* | 8/2016 | Cheng ...................... | B81B 7/02 |

\* cited by examiner

*Primary Examiner* — Thien F Tran
(74) *Attorney, Agent, or Firm* — Norton Rose Fulbright US LLP; Gerard Messina

(57) ABSTRACT

A micromechanical component having a main extension plane is provided; the micromechanical component encloses a first cavern and a second cavern, and a first pressure prevails in the first cavern while a second pressure prevails in the second cavern, and a first layer of the micromechanical component, which extends essentially parallel to the main extension plane, projects into a second layer of the micromechanical component, which extends essentially parallel to the main extension plane, between the first cavern and the second cavern, essentially in a perpendicular direction to the main extension plane.

10 Claims, 4 Drawing Sheets

MICRO-MECHANICAL COMPONENT

RELATED APPLICATION INFORMATION

The present application claims priority to and the benefit of German patent application no. 10 2016 214 966.0, which was filed in Germany on Aug. 11, 2016, the disclosure which is incorporated herein by reference.

FIELD OF THE INVENTION

The present invention is based on a micromechanical component.

BACKGROUND INFORMATION

A micromechanical component of this type is generally known. For example, the document U.S. Pat. No. 8,546,928 B2 describes a micromechanical component which has two caverns; here, both a relatively low internal cavern pressure for a rate-of-rotation sensor of the micromechanical component and a relatively high internal cavern pressure for an acceleration sensor of the micromechanical component are provided on the same chip. The internal cavern pressure for the rate-of-rotation sensor is kept at a relatively low level with the aid of a getter situated inside the cavern.

However, in the course of the miniaturization of components, the number of sensors that make different demands on the internal cavern pressures on the same chip is rising.

SUMMARY OF THE INVENTION

It is an object of the present invention to provide a micromechanical component that exhibits fewer changes in the properties, in particular in the quality of the micromechanical component over the service life of the micromechanical component, and to do so is an uncomplicated and economical manner.

In a micromechanical component according to the description herein, this objective is achieved in that a first layer of the micromechanical component, which essentially extends parallel to the main extension plane, projects into a second layer of the micromechanical component, which essentially extends parallel to the main extension plane, between the first cavern and the second cavern essentially in a perpendicular direction to the main extension plane.

In a micromechanical component according to the description herein, the objective is achieved in that a first layer of the micromechanical component, which extends essentially parallel to the main extension plane, projects into a second layer of the micromechanical component, which extends essentially in parallel with the main extension plane, essentially in a perpendicular direction to the main extension plane.

This advantageously provides a diffusion barrier or a gas-diffusion barrier or an interruption of the gas-diffusion path within a plane extending along the second layer parallel to the main extension plane. As a result, atoms or molecules that diffuse through the second layer from the first cavern in the direction of the second cavern, or from the second cavern in the direction of the first cavern, or from an environment of the micromechanical component in the direction of the first cavern, or from the first cavern in the direction of the environment of the micromechanical component, are hampered in their diffusion by the first layer in the region of the first layer that projects into the second layer in the plane extending along the second layer, or such a diffusion of the atoms or molecules is heavily reduced by the first layer. Thus, a diffusion of atoms or molecules from the first cavern in the direction of the second cavern, or from the second cavern in the direction of the first cavern, or from an environment of the micromechanical component in the direction of the first cavern, or from the first cavern in the direction of the environment of the micromechanical component is reduced. As a result, the gas exchange between the two caverns or between an environment of the micromechanical component and the first cavern is markedly reduced. The first pressure and the second pressure, or the internal pressure of the two cavities, or the first pressure is thereby able to be kept constant in comparison with the related art, in particular without the use of getters, this being achieved in a simple and economical manner. In contrast to the related art, a change in the properties, in particular in the quality of the micromechanical component across the service life of the micromechanical component, is kept low in an uncomplicated and cost-effective manner.

In particular, the present invention allows for the placement of two cores, each having a cavern with a different internal pressure, next to each other on one chip without the need to stabilize the internal pressure of one or of both caverns through the use of a getter material. The implementation of the present invention merely requires an adaptation of the sensor layout. A gas exchange between the two caverns during storage of the micromechanical component at high temperatures, as is common during product testing, is also reduced, thereby making it possible to provide an especially cost-effective, simple and compact micromechanical component.

The first layer has a first diffusion coefficient for the diffusion of hydrogen in the first layer, a further first diffusion coefficient for the diffusion of helium in the first layer, and a third first diffusion coefficient for the diffusion of neon in the first layer. In addition, the second layer has a second diffusion coefficient for the diffusion of hydrogen in the second layer, a further second diffusion coefficient for the diffusion of helium in the second layer, and a third second diffusion coefficient for the diffusion of neon in the second layer. Here, the first and/or the further first, and/or the third first diffusion coefficient may be smaller than the second and/or the further second, and/or the third second diffusion coefficient. This advantageously provides for a selective adjustment of the diffusion of hydrogen and/or helium and/or neon from the first cavern in the direction of the second cavern, or from the second cavern in the direction of the first cavern by the projection of the first layer into the second layer.

In the context of the present invention, the term "micromechanical component" is to be understood to include both micromechanical components as well as micro-electromechanical components.

Advantageous further refinements and further developments of the present invention are able to be gathered from the dependent claims and from the specification with reference to the drawings.

According to a further development, the first layer includes silicon, in particular doped, monocrystalline and/or polycrystalline silicon or poly-Si. It furthermore may be the case that the first layer includes aluminum and/or germanium and/or a nitride, and especially preferably, aluminum nitride and/or silicon nitride.

According to a further development, the second layer includes an oxide layer, which may be a silicon oxide layer, especially preferably, a silicon dioxide layer. In an advantageous manner, this makes it possible that with a placement of two cores having different internal cavern pressures on one chip above silicon dioxide layers that are disposed between the two caverns, no gas exchange or only a reduced gas exchange in comparison with the related art, is able to take place between the two caverns.

According to a further development, the first layer projects into the second layer in such a way that the micromechanical component includes a separation region that separates the second layer. The separation region is situated between the first cavern and the second cavern, and/or parallel to the main extension plane enclosing the first cavern, and/or parallel to the main extension plane enclosing the second cavern.

Preferably, the separation region is disposed parallel to the main extension plane enclosing the first cavern at least partially, which may be at least 90% of a circumference surrounding the first cavern parallel to the main extension plane, especially preferably, at least 95% of the circumference, and most preferably, at least 99% of the circumference. In addition, the separation region may be disposed parallel to the main extension plane at least partially enclosing the second cavern, which may be at least 90% of a further circumference surrounding the second cavern parallel to the main extension plane, especially preferably, at least 95% of the further circumference, and most preferably, at least 99% of the further circumference. This advantageously makes it possible for a diffusion through the second layer from the first cavern in the direction of the second cavern, or from the second cavern in the direction of the first cavern, and/or from an environment of the micromechanical component in the direction of the first cavern, and/or from an environment of the micromechanical component in the direction of the second cavern to be prevented or to be made more difficult.

According to a further development, the first layer projects into the second layer in such a way that a first layer region of the second layer and a second layer region of the second layer are disposed at a distance from each other parallel to the main extension plane. This advantageously allows for a separation of the second layer into a first layer region and into a second layer region in such a way that a diffusion of atoms and/or molecules parallel to the main extension plane within the second layer, from the first layer region to the second layer region or from the second layer region to the first layer region, is not possible; therefore, the atoms and/or molecules must diffuse parallel to the main extension plane through regions that differ from the second layer in order to move from the first layer region to the second layer region or from the second layer region to the first layer region.

According to a further development, a first layer region of the second layer encloses the first cavern in a plane parallel to the main extension plane. This advantageously makes it possible that atoms and/or molecules must diffuse within the plane from the first cavern through the first layer region.

According to a further development, a second layer region of the second layer encloses the second cavern in a plane parallel to the main extension plane. This advantageously makes it possible that atoms and/or molecules within the plane must diffuse from the second cavern through the second layer region.

According to a further development, the first layer projects into the second layer in such a way that a first layer region of the second layer and a third layer region of the second layer are disposed at a distance from each other parallel to the main extension plane. This advantageously allows for a separation of the second layer into a first layer region and into a third layer region in such a way that a diffusion of atoms and/or molecules parallel to the main extension plane within the second layer from the first layer region to the third layer region, or from the third layer region to the first layer region is impossible; therefore, the atoms and/or molecules must diffuse parallel to main extension plane through regions that differ from the second layer in order to move from the first layer region to the third layer region or from the third layer region to the first layer region.

According to a further development, the first layer projects into the second layer in such a way that a second layer region of the second layer and a third layer region of the second layer are disposed at a distance from each other parallel to the main extension plane. This advantageously allows for a separation of the second layer into a second layer region and into a third layer region in such a way that a diffusion of atoms and/or molecules parallel to the main extension plane within the second layer, from the second layer region to the third layer region or from the third layer region to the second layer region, is impossible; therefore, the atoms and/or molecules must diffuse parallel to the main extension plane through regions that differ from the second layer in order to move from the second layer region to the third layer region or from the third layer region to the second layer region.

According to a further development, a third layer region of the second layer encloses a first layer region of the second layer in a plane parallel to the main extension plane. This advantageously allows for the development of a separation region that extends in the plane between the third layer region and the first layer region.

According to a further development, a third layer region of the second layer encloses a second layer region of the second layer in a plane parallel to the main extension plane. This advantageously allows for the development of a separation region that extends in the plane between the third layer region and the second layer region.

According to a further development, the first pressure is lower than the second pressure, and a first sensor unit for the rate-of-rotation measurement is disposed inside the first cavern while a second sensor unit for the acceleration measurement is disposed inside the second cavern. In an advantageous manner, a micromechanical component for the rate-of-rotation measurement and for the acceleration measurement whose quality is stable over the service life of the micromechanical component is thereby able to be provided in an uncomplicated manner. The first cavern and the second cavern may be disposed on one chip. This advantageously allows the first cavern and the second cavern, or the first sensor unit and the second sensor unit, to be produced in the identical layer method, thereby offering an especially time-efficient production method. Especially preferably, the first pressure and/or the second pressure is/are adjusted by opening and resealing the first cavern and/or the second cavern at a first ambient pressure and/or at a second ambient pressure, in such a way that directly after the resealing, the first pressure essentially corresponds to the first ambient pressure and/or the second pressure essentially corresponds to the second ambient pressure.

A gas exchange between the first cavern and the second cavern, and/or a gas exchange between the first cavern and/or the second cavern on the one hand, and the environment of the micromechanical component on the other may be reduced with the aid of the present invention. As a result, in particular the vacuum enclosed in the first cavern of the first sensor unit for the rate-of-rotation measurement is stabilized across the service life. This leads to a relatively low change in the quality and the sensor properties of the first sensor unit for the rate-of-rotation measurement in comparison with the related art.

In all cases, identical parts have been provided with the same reference numerals in the various figures and are therefore also denoted or mentioned only once as a rule.

DETAILED DESCRIPTION

Figure 1:
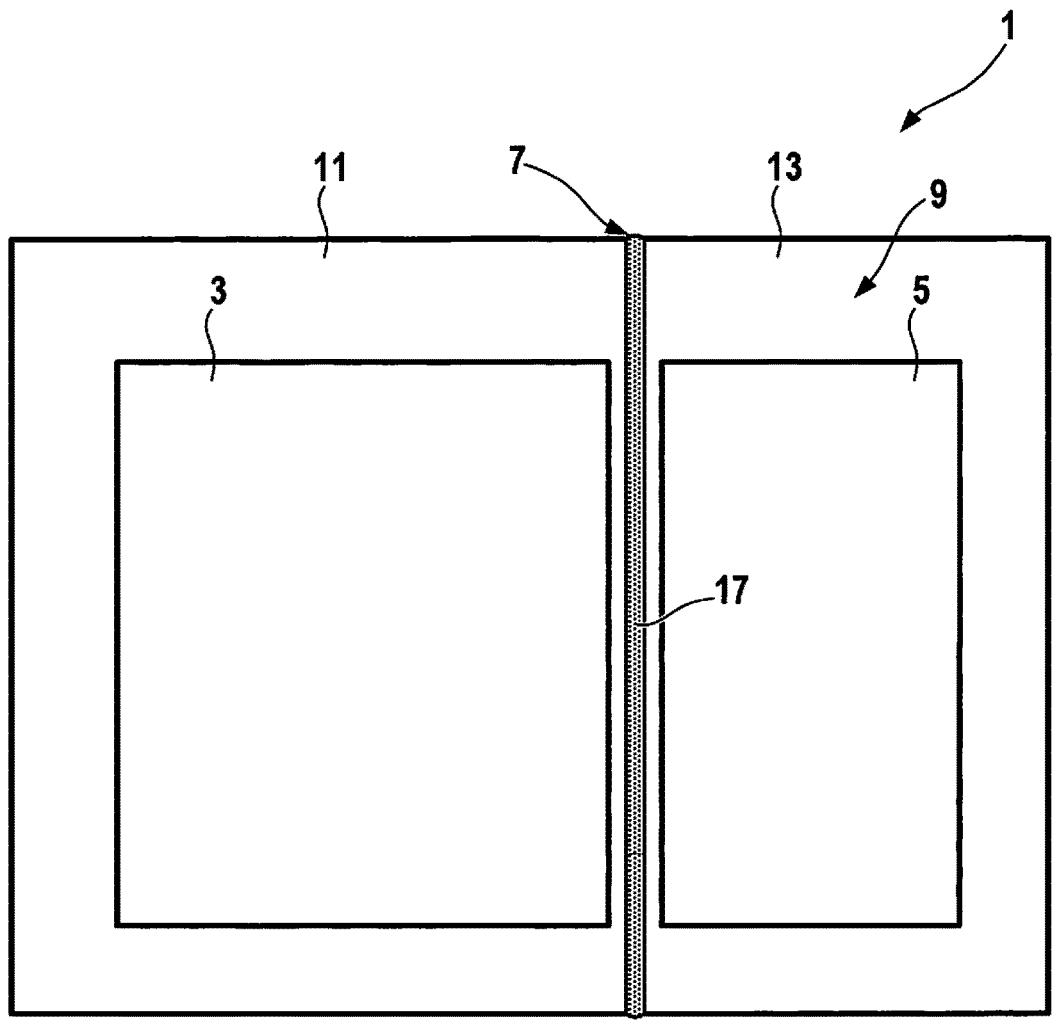
FIG. 1 shows a schematic representation of a micromechanical component according to an exemplary specific embodiment of the present invention.

FIG. 1 shows a schematic representation of a micromechanical component 1 according to an exemplary specific embodiment of the present invention, micromechanical component 1 having a main extension plane 100. Main extension plane 100 may be a main extension plane of a substrate 19 of micromechanical component 1. Micromechanical component 1 encloses a first cavern 3 and a second cavern 5, and a first pressure prevails in first cavern 3 and a second pressure prevails in second cavern 5. Especially preferably, the first pressure is lower than the second pressure. A first sensor unit for the rate-of-rotation measurement, i.e. a rate-of-rotation sensor, is disposed in first cavern 3, and a second sensor unit for the acceleration measurement, i.e. an acceleration sensor, is disposed in second cavern 5.

Micromechanical component 1 preferably encompasses a base structure, which includes substrate 19, and a cap structure. The base structure is connected to the cap structure, especially in an intermaterial manner, via a bond frame of micromechanical component 1, so that both first cavern 3 and second cavern 5 are enclosed by micromechanical component 1, e.g. separated from each other by a bond segment in each case.

It furthermore may be the case that a first gas mixture having a first chemical composition is enclosed in first cavern 3 and that a second gas mixture having a second chemical composition, which may be a gas fill for an acceleration-sensor cavern, is enclosed in second cavern 5. The first chemical composition differs from the second chemical composition. Preferably, the first pressure is less than 10 mbar, especially preferably, less than 5 mbar, and most preferably, less than 1 mbar. In addition, the second pressure may be between 20 mbar and 2000 mbar, especially preferably, between 50 mbar and 750 mbar, and most preferably, between 450 mbar and 550 mbar.

Micromechanical component 1 shown in FIG. 1 includes a first layer 7 and a second layer 9, second layer 9 preferably including an oxide layer, especially preferably, a silicon dioxide layer. First layer 7 and second layer 9 extend essentially parallel to main extension plane 100. First layer 7 projects into second layer 9 between first cavern 3 and second cavern 5 essentially in a direction perpendicular to main extension plane 100. A separation region 17 of micromechanical component 1 that separates second layer 9 may be developed in this manner.

Preferably, separation region 17 is provided as an interruption of the gas-diffusion path in the layout of the sensor core by interrupting the oxide layers or the oxides, in particular between first cavern 3 and second cavern 5.

In the exemplary embodiment shown in FIG. 1 by way of example, separation region 17 is situated between first cavern 3 and second cavern 5. In addition, first layer 7 projects into second layer 9 in such a way that a first layer region 11 of second layer 9 and a second layer region 13 of second layer 9 are situated at a distance from each other parallel to main extension plane 100. In other words, separation region 17 separates first layer region 11 from second layer region 13, that is to say, first layer region 11 and second layer region 13 are at least partially separated from each other by separation region 17. For example, it is also provided and not shown in FIG. 1 that first layer region 11 and second layer region 13 are developed in such a way that first layer region 11 and second layer region 13 are at least partially in contact with each other, especially at the ends of a main extension direction of separation region 17 that lie opposite each other.

In addition, it is shown in FIG. 1 by way of example that first layer region 11 encloses first cavern 3 and that second layer region 13 encloses second cavern 5 in a plane parallel to main extension plane 100.

In addition, it is illustrated in FIG. 1 by way of example that separation region 17 is developed in linear form essentially parallel to main extension plane 100 and is situated in a plane parallel to main extension plane 100 between first cavern 3 and second cavern 5, as well as between first layer region 11 and second layer region 13. Here, for example, it is provided that separation region 17 is developed in uninterrupted form from a first area of micromechanical component 1 that extends perpendicular to main extension plane 100, to a second area of micromechanical component 1 that extends perpendicular to main extension plane 100. Preferably, the first area, which may be an external area of micromechanical component 1, is disposed parallel to the second area, which may be another external area of micromechanical component 1. In other words, separation region 17 is developed in the form of a separation web between first cavern 3 and second cavern 5.

Figure 2:
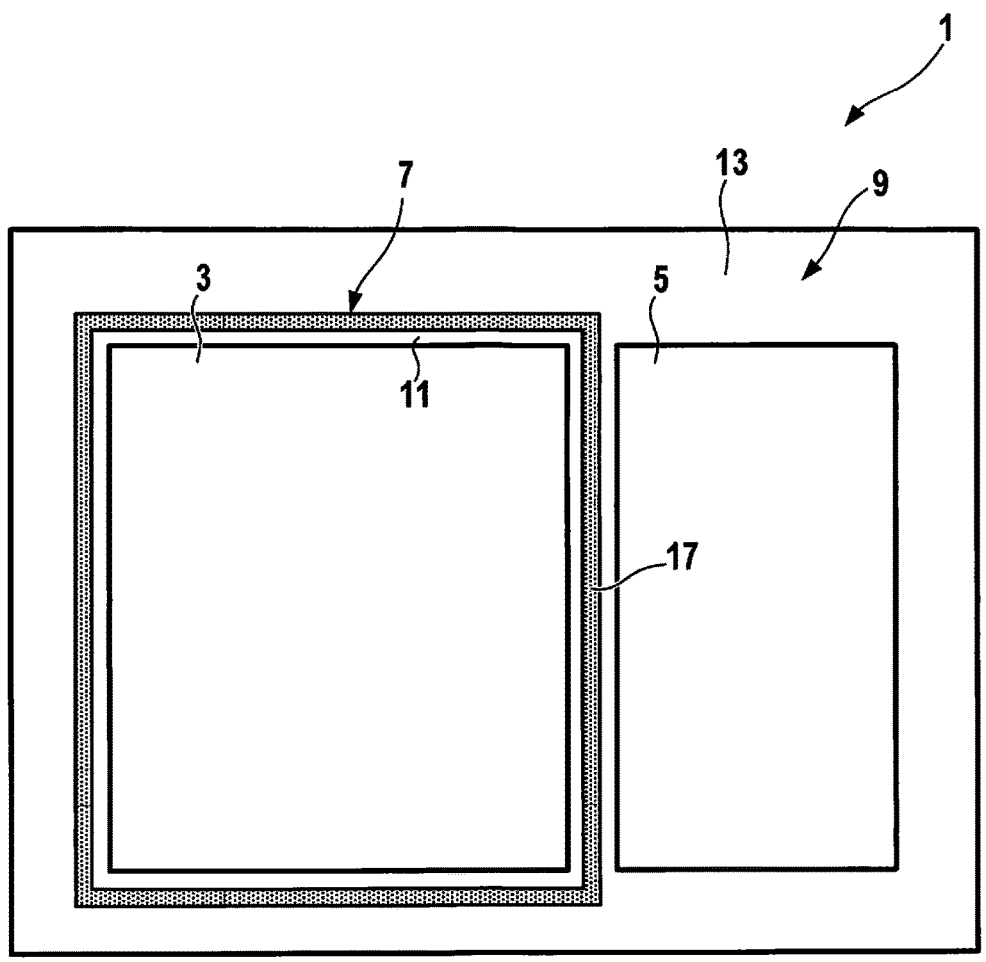
FIG. 2 shows a schematic representation of a micromechanical component according to a further exemplary specific embodiment of the present invention.

FIG. 2 shows a schematic illustration of a micromechanical component 1 according to a further exemplary specific embodiment of the present invention. The specific embodiment shown in FIG. 2 essentially corresponds to the specific embodiment shown in FIG. 1. In the specific embodiment shown in FIG. 2, separation region 17 is developed in such a way that it encloses first cavern 3 parallel to main extension plane 100. In other words, separation region 17 is developed circumferentially around first cavern 3. For example, it is shown here that separation region 17 is disposed between first cavern 3 and second cavern 5 and parallel to main extension plane 100 such that it encloses first cavern 3. However, as an alternative, it is also provided that separation region 17 is disposed so as to enclose only first cavern 3 parallel to main extension plane 100. For example, it is provided here that separation region 17 is situated in such a way that it encloses both first cavern 3 and second cavern 5 but is not situated between first cavern 3 and second cavern 5.

In addition, FIG. 2 illustrates that separation region 17 has a closed, and, in particular, an essentially rectangular, path- or line-shaped extension. This advantageously makes it possible to produce micromechanical component 1 according to the present invention using standard production methods or reactors or accessories for the most part. In addition, this easily makes it possible for the separation region to at least partially enclose first layer region 11 and/or second layer region 13 and/or first cavern 3 and/or second cavern 5 in a plane parallel to main extension plane 100. In other words, separation region 17 is developed circumferentially around first cavern 3.

Figure 3:
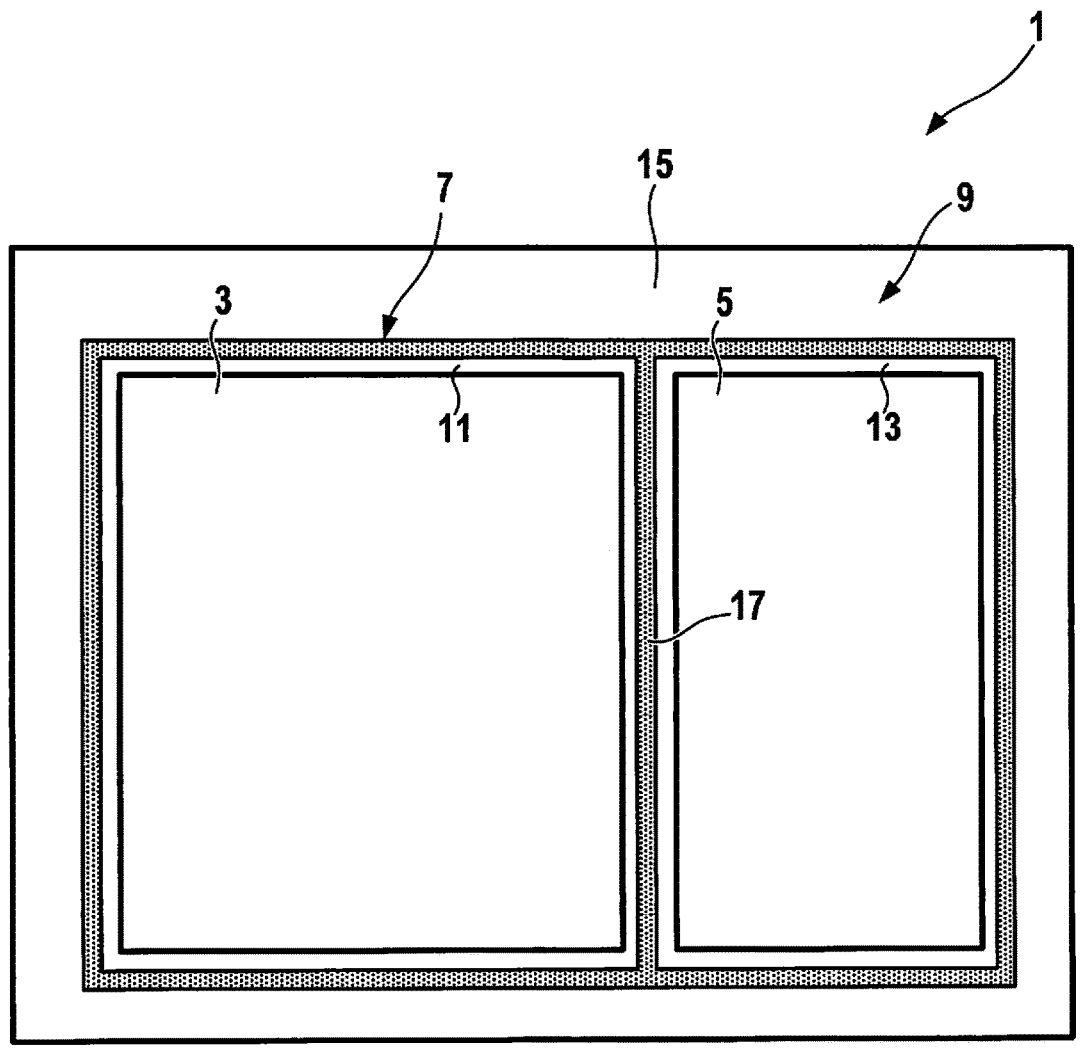
FIG. 3 shows a schematic representation of a micromechanical component according to a third exemplary embodiment of the present invention.

FIG. 3 shows a schematic illustration of a micromechanical component 1 according to a third exemplary specific embodiment of the present invention, in which the specific embodiment shown in FIG. 3 essentially corresponds to the specific embodiments shown in FIG. 1 and FIG. 2. However, in the specific embodiment shown in FIG. 3, first layer 7 projects into second layer 9 in such away that first layer region 11 and a third layer region 15 of second layer 9 are disposed at a distance from each other parallel to main extension plane 100. In addition, first layer 7 projects into second layer 9 in such a way that second layer region 13 and third layer region 15 are disposed at a distance from each other in parallel to main extension plane 100. In addition, third layer region 15 encloses first layer region 11 in a plane parallel to main extension plane 100, and third layer region 15 encloses second layer region 13 in the plane.

In the exemplary embodiment shown in FIG. 3, separation region 17 is disposed between first cavern 3 and second cavern 5 and is situated parallel to main extension plane 100 so as to enclose first cavern 3 and parallel to main extension plane 100 so as to enclose second cavern 5. Here, separation region 17 has a closed and, in particular, an essentially rectangular, path- or line-shaped extension. In other words, separation region 17 is developed circumferentially around first cavern 3 and around second cavern 5.

Figure 4:
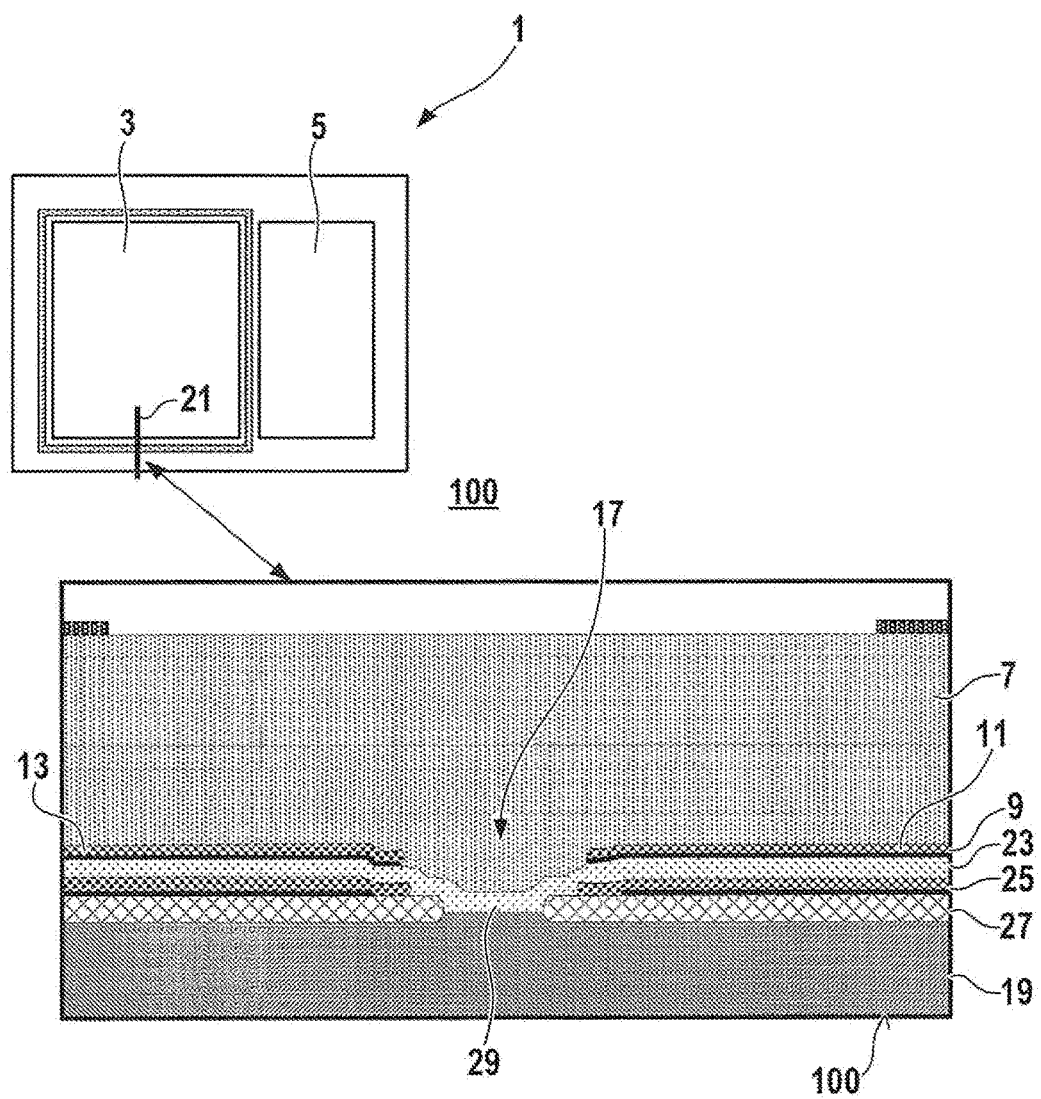
FIG. 4 shows a schematic representation of a micromechanical component according to the further exemplary specific embodiment of the present invention.

FIG. 4 shows a schematic illustration of a micromechanical component 1 according to the further exemplary embodiment of the present invention, the specific embodiment shown in FIG. 4 essentially corresponding to the specific embodiments illustrated in FIG. 2 and in FIG. 3. In this instance, FIG. 4 shows a sectional view that extends perpendicular to main extension plane 100 along line 21. FIG. 4 shows a cross-section through the interruption of the oxides by way of example.

The sectional view in FIG. 4 exemplarily shows first layer 7, second layer 9, first layer region 11, second layer region 13, separation region 17, as well as substrate 19 and main extension plane 100. In addition, the sectional view in FIG. 4 shows a further first layer 23 by way of example. The further first layer 23 projects into a further second layer 25 and into a third second layer 27 essentially in a perpendicular direction to main extension plane 100 and thus forms a further separation region 29. For example, micromechanical component 1 encompasses separation region 17 and further separation region 29 in such a way that separation region 17 and further separation region 29 is [sic] situated between first cavern 3 and second cavern 5, and/or parallel to main extension plane 100 so as to enclose first cavern 3 and/or parallel to main extension plane 100 so as to enclose second cavern 5, and separates [sic] second layer 9, further second layer 25 and third second layer 27 into first layer region 11 and second layer region 13, into a first layer region and a second layer region of the further second layer 25, and into a first and a second layer region of third second layer 27, respectively.

FIG. 4 shows by way of example that second layer 9 is disposed outside of separation region 17 on a side of first layer 7 that faces substrate 19, and that further first layer 23 is disposed outside of separation region 17 on a side of second layer 9 that faces substrate 19. In addition, FIG. 4 shows by way of example that further second layer 25 is situated on a side of further first layer 23 that faces substrate 19, and that third second layer 27 is situated on a side of further second layer 25 that faces substrate 19.

In addition, FIG. 4 shows by way of example that second layer 9 encompasses two oxide layers, which may be two silicon oxide layers, and most preferably, two silicon dioxide layers, and that further second layer 25 encompasses two oxide layers, which may be two silicon oxide layers, and most preferably, two silicon dioxide layers. On the one hand, this advantageously makes it possible to selectively adapt second layer 9 to the surface of further first layer 23, and on the other, it allows for a selective growth behavior during the growth or deposition in the course of the production of second layer 9. Moreover, in an advantageous manner, it is possible to adapt further second layer 25 to the surface of third second layer 27 or to a fourth layer deposited or grown on third second layer 27 in a selective manner, and to simultaneously enable a selective growth behavior during the growth or deposition in the production of further second layer 25.

What is claimed is:

1. A micromechanical component, comprising:
   a micromechanical component arrangement having a main extension plane, the micromechanical component arrangement enclosing a first cavern and a second cavern;
   wherein a first pressure prevails in the first cavern and a second pressure prevails in the second cavern,
   wherein a first layer of the micromechanical component arrangement, which extends essentially parallel to the main extension plane, projects into a second layer of the micromechanical component arrangement, which extends essentially parallel to the main extension plane, between the first cavern and the second cavern and essentially in a perpendicular direction to the main extension plane, and
   wherein the first layer projects into the second layer so that the micromechanical component arrangement includes a separation region that separates the second layer, the separation region being situated between the first cavern and the second cavern and/or parallel to the main extension plane so as to enclose the first cavern, and/or parallel to the main extension plane so as to enclose the second cavern.

2. The micromechanical component of claim 1, wherein the second layer includes an oxide layer.

3. The micromechanical component of claim 1, wherein the first layer projects into the second layer so that a first layer region of the second layer and a second layer region of the second layer are disposed at a distance from each other parallel to the main extension plane.

4. The micromechanical component of claim 1, wherein a first layer region of the second layer encloses the first cavern in a plane parallel to the main extension plane.

5. The micromechanical component of claim 1, wherein a second layer region of the second layer encloses the second cavern in a plane parallel to the main extension plane.

6. The micromechanical component of claim 1, wherein the first layer projects into the second layer so that a first layer region of the second layer and a third layer region of the second layer are disposed at a distance from each other parallel to the main extension plane.

7. The micromechanical component of claim 1, wherein the first layer projects into the second layer so that a second layer region of the second layer and a third layer region of the second layer are disposed at a distance from each other parallel to the main extension plane.

8. The micromechanical component of claim 1, wherein the second layer includes a silicon oxide layer.

9. The micromechanical component of claim 1, wherein the second layer includes a silicon dioxide layer.

10. A micromechanical component, comprising:
- a micromechanical component arrangement having a main extension plane, the micromechanical component arrangement enclosing a first cavern and a second cavern;
- wherein a first pressure prevails in the first cavern and a second pressure prevails in the second cavern,
- wherein a first layer of the micromechanical component arrangement, which extends essentially parallel to the main extension plane, projects into a second layer of the micromechanical component arrangement, which extends essentially parallel to the main extension plane, between the first cavern and the second cavern and essentially in a perpendicular direction to the main extension plane, and
- wherein a third layer region of the second layer encloses a first layer region of the second layer in a plane parallel to the main extension plane.

\* \* \* \* \*